(12) United States Patent
Fick

(10) Patent No.: US 11,183,876 B2
(45) Date of Patent: Nov. 23, 2021

(54) POWER ANALYZER AND METHOD FOR THE USE THEREOF

(71) Applicant: Smart Utility Service Holdings Pty Ltd., Victoria (AU)

(72) Inventor: John James Fick, Southbank (AU)

(73) Assignee: Smart Utility Service Holdings Pty Ltd., Victoria (AU)

( * ) Notice: Subject to any disclaimer, the term of this patent is extended or adjusted under 35 U.S.C. 154(b) by 0 days.

(21) Appl. No.: 15/760,702

(22) PCT Filed: Sep. 16, 2016

(86) PCT No.: PCT/AU2016/050872
§ 371 (c)(1),
(2) Date: Mar. 16, 2018

(87) PCT Pub. No.: WO2017/045036
PCT Pub. Date: Mar. 23, 2017

(65) Prior Publication Data
US 2018/0278089 A1   Sep. 27, 2018

(30) Foreign Application Priority Data

Sep. 16, 2015   (AU) .................. 2015903779

(51) Int. Cl.
*H02J 13/00* (2006.01)
*H02J 3/01* (2006.01)
(Continued)

(52) U.S. Cl.
CPC ........ *H02J 13/0001* (2020.01); *G01R 21/133* (2013.01); *G05B 19/0428* (2013.01);
(Continued)

(58) Field of Classification Search
CPC .. H02J 13/0006; H02J 3/383; H02J 2003/007; H02J 2003/003; H02J 3/01;
(Continued)

(56) References Cited

U.S. PATENT DOCUMENTS

2008/0215302 A1* 9/2008 Nasle .................. G06F 17/5009
703/13
2008/0236648 A1* 10/2008 Klein ...................... H02J 3/381
136/244

(Continued)

FOREIGN PATENT DOCUMENTS

| CN | 102169646 B | 3/2013 |
|---|---|---|
| JP | 2014-095941 A | 5/2014 |
| WO | 2015075794 A1 | 5/2015 |

OTHER PUBLICATIONS

International Search Report for parent application PCT/AU2016/050872, dated Nov. 28, 2016.
(Continued)

*Primary Examiner* — Kenneth M Lo
*Assistant Examiner* — Mohammed Shafayet
(74) *Attorney, Agent, or Firm* — Seyfarth Shaw LLP

(57) ABSTRACT

A power analyser for analysing an electrical supply to a load, comprising: a processor; an analogue signal module interfaced with the processor, wherein the analogue signal module is configured to: make analogue signal measurements of the electrical supply, and provide raw analogue data corresponding to said measurements to the processor; and wherein the processor is configured to: access a model suitable for, or associated with, the electrical supply and/or the load, and generate a modified electrical supply estimate in accordance with the model and the raw analogue data.

20 Claims, 8 Drawing Sheets

(51) Int. Cl.
  *G01R 21/133* (2006.01)
  *H02J 3/00* (2006.01)
  *G05B 19/042* (2006.01)
  *G01R 19/25* (2006.01)

(52) U.S. Cl.
  CPC .................... *H02J 3/00* (2013.01); *H02J 3/01* (2013.01); *G01R 19/2513* (2013.01); *G05B 2219/2639* (2013.01); *H02J 3/003* (2020.01); *H02J 13/00006* (2020.01); *H02J 2203/20* (2020.01); *H02J 2300/24* (2020.01); *Y02E 40/40* (2013.01); *Y02E 60/00* (2013.01); *Y04S 40/20* (2013.01)

(58) Field of Classification Search
  CPC ......... H02J 3/00; H02J 3/003; H02J 2203/20; H02J 13/0001; H02J 2300/24; H02J 13/00006; H02J 13/00002; G05B 19/0428; G05B 2219/2639; G01R 19/2513; G01R 21/133; Y02E 40/40; Y02E 60/76; Y02E 60/00; Y02E 10/56; Y04S 40/22; Y04S 40/20; Y04S 10/50; Y04S 10/30
  USPC .......................................................... 700/291
  See application file for complete search history.

(56) References Cited

U.S. PATENT DOCUMENTS

| | | | | |
|---|---|---|---|---|
| 2010/0106342 | A1* | 4/2010 | Ko | G06Q 10/04 700/295 |
| 2011/0251732 | A1* | 10/2011 | Schweitzer, III | H02J 13/0013 700/297 |
| 2011/0252732 | A1 | 10/2011 | Schweitzer, III et al. | |
| 2012/0143383 | A1* | 6/2012 | Cooperrider | H04Q 9/00 700/295 |
| 2013/0184879 | A1* | 7/2013 | Xia | H02J 13/0024 700/286 |
| 2013/0253898 | A1* | 9/2013 | Meagher | G06F 17/5009 703/18 |
| 2013/0342359 | A1* | 12/2013 | Miyaji | G08C 17/02 340/870.03 |
| 2014/0107858 | A1* | 4/2014 | Bell | H02J 3/16 700/298 |
| 2014/0122050 | A1* | 5/2014 | Fu | H02J 4/00 703/18 |
| 2014/0159763 | A1* | 6/2014 | Luo | H02S 50/10 324/761.01 |
| 2014/0188295 | A1* | 7/2014 | Saito | G05B 15/02 700/291 |
| 2014/0265574 | A1* | 9/2014 | Tyler | H02J 3/382 307/31 |
| 2014/0277813 | A1* | 9/2014 | Powell | H02J 3/1821 700/298 |
| 2014/0285357 | A1* | 9/2014 | Schlaeffer | G06F 17/5009 340/870.02 |
| 2015/0194812 | A1* | 7/2015 | Bell | G01D 4/004 307/31 |
| 2015/0263525 | A1* | 9/2015 | Fornage | H02J 3/14 307/35 |
| 2015/0276829 | A1* | 10/2015 | Shamir | G01R 21/133 702/62 |
| 2016/0266181 | A1 | 9/2016 | Kawaguchi et al. | |

OTHER PUBLICATIONS

Extended European Search Report for Application No. PCT/AU2016/050872, dated Jul. 12, 2019, 8 pages.

* cited by examiner

POWER ANALYZER AND METHOD FOR THE USE THEREOF

CROSS REFERENCE TO RELATED APPLICATIONS

The present application is a US National Stage application of, and claims priority to, PCT/AU2016/050872, filed Sep. 16, 2016, which claims priority to Australian patent application s/n 2015903779, filed Sep. 16, 2015, the disclosures of which are incorporated herein by reference.

FIELD

The invention generally relates to analysing electrical power supplies and their attached loads.

BACKGROUND

Electrical power is supplied to industry, business, and homes through an electrical grid fed by electrical generators run by power providers. Traditionally, the electrical power is supplied at nominal voltage and frequency, however differences in the actual voltage and/or frequency can occur, and usually does, in different locations of the electrical grid. Furthermore, the actual voltage and frequency is subject to variation over time.

A large number of the electrical devices utilising the electrical power have efficiencies that depend on the actual voltage and/or frequency applied. Typically, such devices are designed with a particular voltage and frequency in mind (for example, the nominal voltage and frequency of the electrical grid). Variations in these properties away from the particular design voltage and frequency can result in sub-optimal efficiency of the devices and shortening of the design life of the equipment. That is, the actual electrical energy used by the electrical devices is not optimal (usually, such use is higher than necessary).

Voltage optimising equipment has been developed which can be installed between an electrical load and the power supply. The purpose of the voltage optimising equipment is to modify the voltage provided by the electrical grid to eliminate or at least reduce the difference between the actual supplied voltage and the particular design voltage of the load.

SUMMARY OF THE INVENTION

According to an aspect of the present invention, there is provided a power analyser for analysing an electrical supply to a load, comprising: a processor; an analogue signal module interfaced with the processor, wherein the analogue signal module is configured to: make analogue signal measurements of the electrical supply, and provide raw analogue data corresponding to said measurements to the processor; and wherein the processor is configured to: access a model suitable for, or associated with, the electrical supply and/or the load, and generate a modified electrical supply estimate in accordance with the model and the raw analogue data.

The modified electrical supply estimate may be a voltage optimisation estimate. Alternatively, the modified electrical supply estimate may be a secondary power supply estimate, preferably a photovoltaic (PV) supply estimate.

The modified electrical supply estimate is typically associated with a modification apparatus. The particular modification apparatus may be a voltage optimiser. Alternatively, the particular modification apparatus may be a secondary power supply apparatus, preferably a photovoltaic power supply.

Optionally, the model is obtained from a database of pre-generated models. Each pre-generated model may be associated with a load type, preferably selected from one of: a discrete load; and collection of loads. Each pre-generated model may be associated with a particular modification apparatus.

The processor may be configured to process the raw analogue data to produce measured analogue data. In this case, the measured analogue data is optionally selected from one or more of: voltage; current; frequency; spectrum; harmonics and interharmonics; and total harmonic distortion.

The processor may be configured to process the raw analogue data to produce derived analogue data. In this case, the derived analogue data is optionally selected from one or more of: RMS voltage; RMS current; real, reactive, and/or apparent power components; frequency of fundamental power signal; phase balance for each of 3 phase voltage and/or 3 phase current measurement; phase angle between voltage and current measurement; power factor between voltage and current measurement; phase identification of individual voltage and current measurements; frequency spectrum; harmonic levels for each of a plurality of power frequency harmonics; and total harmonic distortion (THD).

Optionally, the analogue signal module comprises one or more analogue interfaces, each configured to produce an analogue signal. In this case, at least one analogue interface may be interfaced with an analogue filter module, and the, or each, analogue filter module may be configured to apply a filter to the analogue signal generated by its associated analogue interface. Each analogue filter is typically configured to be selectively enabled or disabled. The analogue signal module may comprise at least one analogue-to-digital converter (ADC) for receiving the one or more analogue signals. Optionally, at least one analogue interface is a voltage interface and/or at least one analogue interface is a current interface. In this case, the may be a first group comprising one or more voltage interfaces and a second group comprising another one or more voltage interfaces, preferably wherein the first group is an input group and the second group is an output group. At least one of the first and second groups typically comprises one or more analogue interfaces.

The power analyser may further comprise a digital signal module, interfaced with the processor and comprising one or more digital input interfaces.

The power analyser may further comprise an additional signal module, interfaced with the processor and comprising one or more additional inputs. In this case, the, or each, additional input is optionally configured to receive local environmental data, for example selected from: temperature; humidity; and air-pressure.

The power analyser may further comprise a data input/output (data I/O) module interfaced with the processor. In this case, the data I/O module is optionally configured to enable communication between the processor and an external computing device.

The power analyser may further comprise a human interface device (HID) module interfaced with the processor. In this case, the HID module is optionally configured to display information generated by the processor to a user and/or to receive input from a user.

The power analyser may further comprise a controller port for enabling control of the load by the processor.

The power analyser may further comprise a location module, preferably including a GPS unit, interfaced with the processor and configured to determine a location of the power analyser.

According to another aspect of the present invention, there is provided a method of providing a modified electrical supply estimate, comprising the steps of: monitoring an electrical supply to a load to generate raw analogue data associated with the electrical supply to the load; accessing a model suitable for, or associated with, the electrical supply and/or the load; generating a modified electrical supply estimate in accordance with the model and the raw analogue data.

The method may further comprise the step of: displaying the modified electrical supply estimate in real-time.

The modified electrical supply estimate may be a voltage optimisation estimate. Alternatively, the modified electrical supply estimate may be a secondary power supply estimate, preferably wherein the secondary power supply estimate is a photovoltaic (PV) supply estimate.

The modified electrical supply estimate is typically associated with a modification apparatus.

The particular modification apparatus is a voltage optimiser. Alternatively, the particular modification apparatus may be a secondary power supply apparatus, preferably a photovoltaic power supply.

The method may further comprise the step of providing a user interface by which a user selects the model. Optionally, in this case, the model is selected from a database of pre-generated models. Optionally, the user interface provides the user with means to identify a suitable pre-generated model for selection as the model. Each pre-generated model may be associated with a load type, preferably selected from one of: a discrete load; and collection of loads.

The method may further comprise the step of: generating measured analogue data from the raw analogue data. In this case, the measured analogue data is optionally utilised to generate the modified electrical supply estimate. Also in this case, the method may further comprise the step of presenting the measured analogue data.

The method may further comprise the step of: generating derived analogue data from the raw analogue data. In this case, the derived analogue data is optionally utilised to generate the modified electrical supply estimate. Also in this case, the method may further comprise the step of presenting the derived analogue data.

Optionally, the step of monitoring an electrical supply to a load to generate raw analogue data associated with the electrical supply comprises measuring a voltage of the electrical supply. Also optionally, the step of monitoring an electrical supply to a load to generate raw analogue data associated with the electrical supply comprises measuring a current of the electrical supply.

The method may further comprise the following step: storing in a storage memory the raw analogue data and/or data derived from the raw analogue data and/or modified electrical supply estimate.

The method may be performed by the power analyser of the first aspect. Optionally, the method further comprises the step of: calibrating the analogue input module of the power analyser. The method may comprise the step of communicating a precision measurement value from a calibration device to the analogue input module. The power the power analyser may request confirmation of the value of the analogue signal being provided by the calibration device from the calibration device. Alternatively, the power analyser may obtain suitable calibration coefficient(s) from a network accessible calibration database.

According to another aspect of the present invention, there is provided a system for generating a modified electrical supply estimate, the system comprising: an electrical supply monitor configured to monitor an electrical supply to a load and to generate raw analogue data associated with the electrical supply to the load; a model accessor configured to access a model suitable for, or associated with, the electrical supply and/or the load; a modified electrical supply estimate generator, configured to generate a modified electrical supply estimate in accordance with the model and the raw analogue data.

BRIEF DESCRIPTION OF THE DRAWINGS

Embodiments of the invention will now be described by way of example only with reference to the accompanying drawings in which.

DETAILED DESCRIPTION OF EMBODIMENTS

Figure 1:
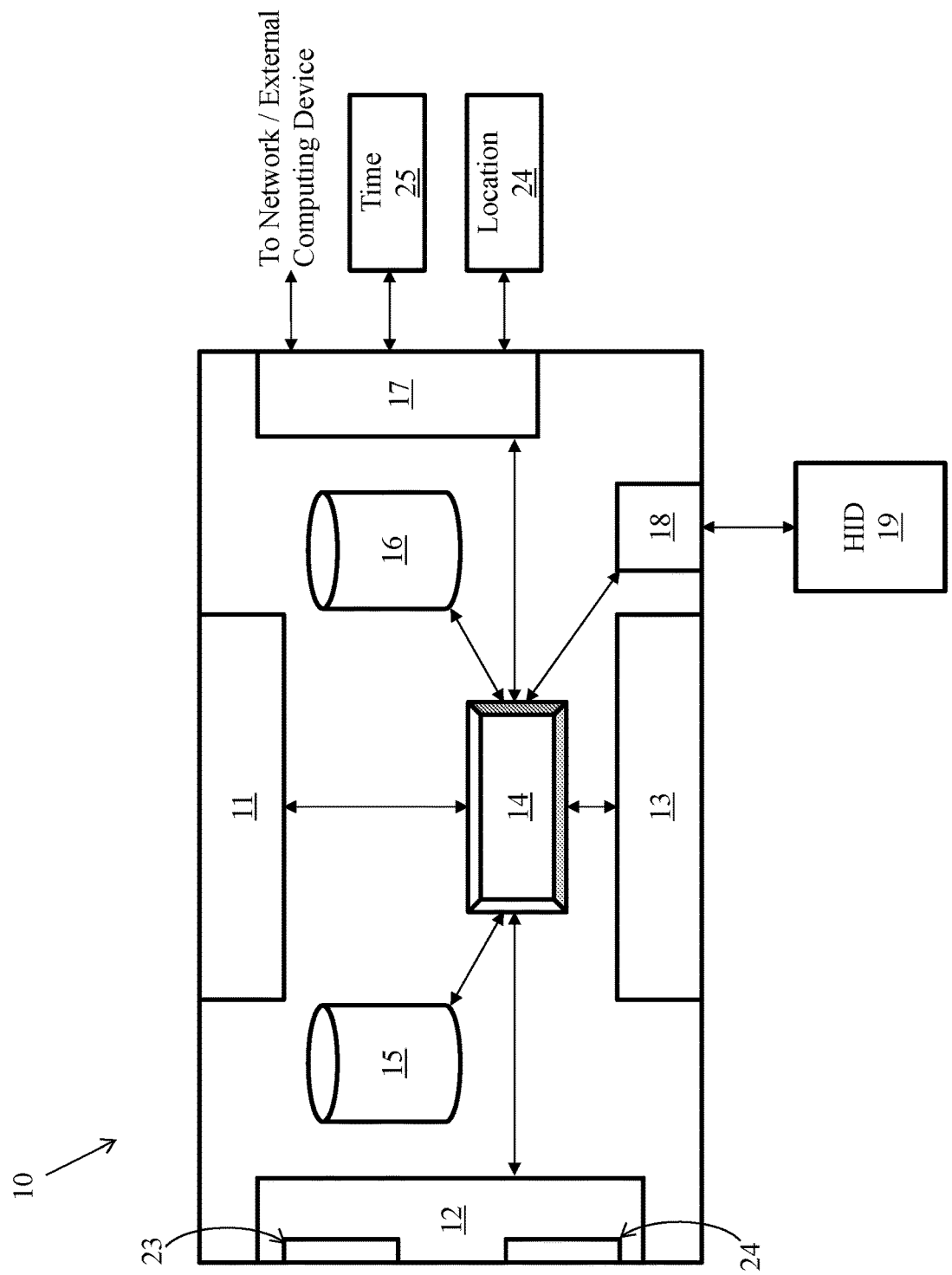
FIG. 1 shows a power analyser according to embodiments.

Referring to FIG. 1, the power analyser 10 comprises an analogue input module 11 and optionally a digital input module 12. The power analyser 10 also optionally comprises an additional input module 13. In the embodiments described herein, it will be assumed that the optional digital input module 12 and optional additional input module 13 are present. Herein, reference to "input modules 11-13" is taken to be reference to the analogue input module 11, digital input module 12, and additional input module 13 collectively.

The power analyser 10 includes a processor 14 interfaced with the input modules 11-13. The processor 14 is configured for receiving and processing data acquired by the input modules 11-13. The processor 14 can comprise one central processing unit (CPU), or in another embodiment, a plurality of CPUs in communication with one another. Optionally, the processor 14 is interfaced to one or more floating point units. In an embodiment, the processor 14 implements ARM architecture. The processor 14 can be a 32-bit RISC processor.

The processor 14 is interfaced with a storage memory 15 and a program memory 16. The storage memory 15 can be located in an interfaced storage memory module, for example an attached solid state memory, such as flash memory. The storage memory 15 is configured for storing data obtained by the processor 14 from the input modules 11-13, either in a raw state or after processing by the processor 14, as required. The storage memory module, in an embodiment, is a removable module such as an SD card.

The program memory 16 can be located in an interfaced program memory module, which can be the same or different hardware as the storage memory module. That is, the storage memory 15 and the program memory 16 can be implemented within the same or different hardware. Furthermore, one or both of the program memory 16 and storage memory 15 can be implemented in a plurality of different hardware components. It is also envisaged that the processor can be implemented within the same hardware as either or both of the memories 15, 16. The program memory 16 is configured for storing instructions executable by the processor 14, and is preferably configured to be modified, for example through memory write operations.

Figure 2:
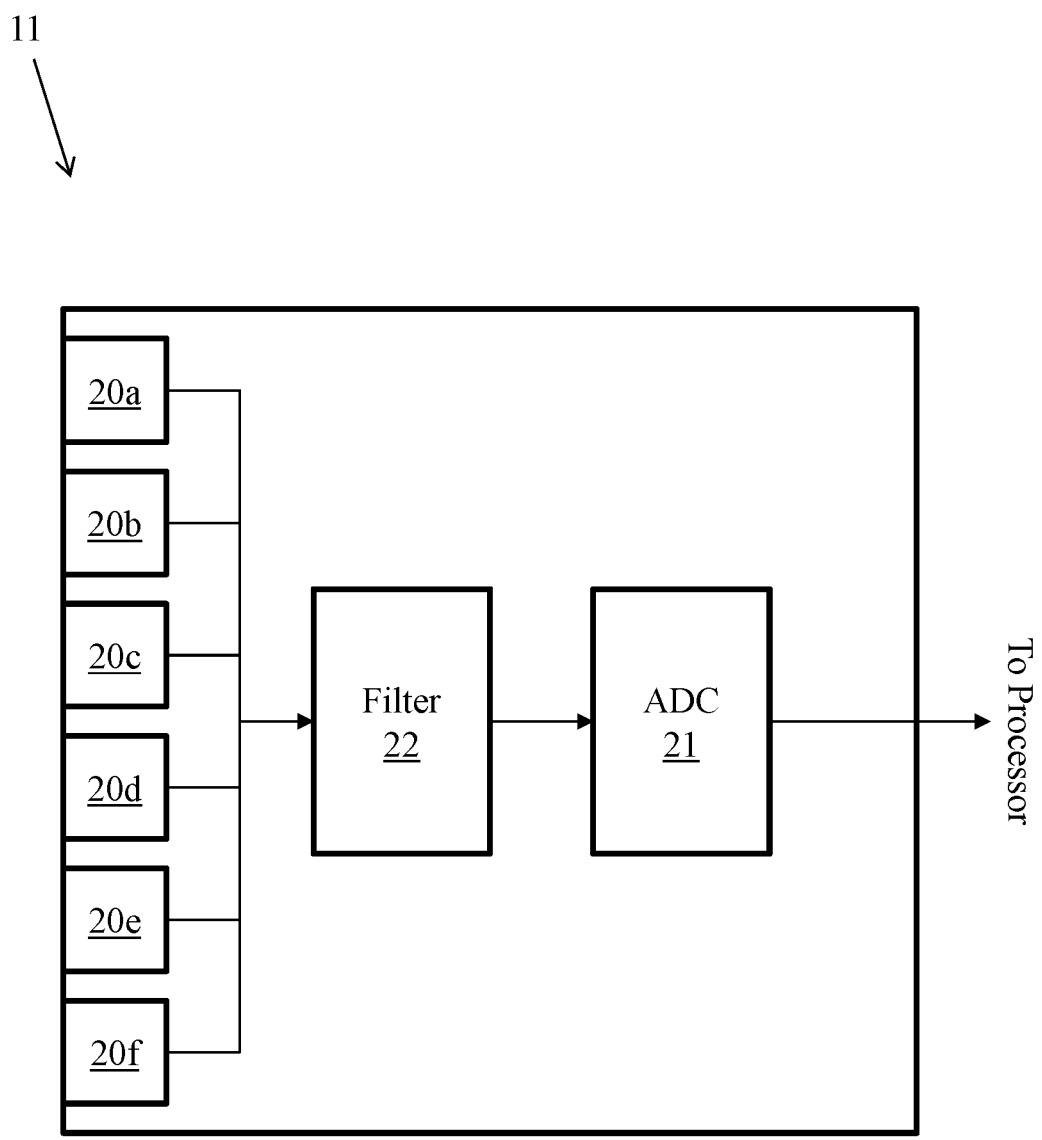
FIG. 2 shows the analogue input module of an embodiment.

FIG. 2 shows the analogue signal module 11 in further detail. The analogue signal module 11 comprises one or more analogue interfaces 20 (six analogue interfaces 20a-20f are shown), which are each configured for connection to an electrical supply ("power supply"). The one or more analogue interfaces 20 each thereby produce an analogue signal. In an embodiment, at least one and preferable each analogue interface 20 is interfaced with an analogue filter module 22. The analogue filter module 22 can be configurable (for example, the analogue filter module 22 can be turned on or off), and furthermore configured when "on" to apply one or more different analogue signal filters to an analogue signal or a plurality of analogue signals received from the, or each, analogue interface 20. Alternatively, the analogue single module 22 is permanently configured to apply one or more different analogue signal filters to the received analogue signal or signals.

The, or each, analogue interface 20 is interfaced with an analogue to digital converter (ADC) 21 (where applicable, via the analogue signal module 22). There can be an ADC 21 per analogue interface 20, or in an embodiment there is one or more of the analogue interfaces 20 for a single ADC 21 (such as shown in FIG. 2). The, or each, ADC 21 is configured for producing a digital output suitable for processing by the processor 14, based on the received analogue signal. It can be preferred that, the, or each, ADC 21 is configured for 12-bit (or higher) sampling resolution and a sampling rate of at least 10,000 samples per second. The digital output of an ADC 21 is referred to herein as "raw analogue data".

For convenience, embodiments described below have two types of analogue interface 20: a voltage interface, and a current interface. Such disclosure is not intended to limit the number of analogue interfaces 20 and is merely illustrative. Each type of analogue interface 20 may include circuitry in order to provide an analogue signal corresponding to its type (e.g. voltage or current) suitable for the analogue filter module 22 and/or ADC 21. For example, a current interface 20 may comprise a resistor of known resistance, such that the current interface 20 produces a voltage signal measurable by the ADC 21 which is then convertible into a current signal by the processor 14 or a dedicated signal converter interfaced with both the ADC 21 and the processor 14.

In a particular implementation, there are six voltage interfaces 20 and six current interfaces 20. Furthermore, the six voltage interfaces 20 are grouped into two groups: three voltage interfaces 20 are associated with an input group; and three voltage interfaces 20 are associated with an output group. Similarly, the six current interfaces 20 are grouped into two groups: three current interfaces 20 are associated with the input group; and the other three current interfaces 20 are associated with the output group. It is understood that there may be more than two groups, and there may be a number of voltage and/or current interfaces 20a, 20b different from six.

Referring back to FIG. 1, the digital signal module 12 comprises one or more digital input interfaces 23, which are each configured for connection to an auxiliary device having its own digital interface. The additional signal module 13 comprises one or more additional inputs configured for non-electrical information. For example, the additional inputs can receive information relating to: temperature; humidity; air-pressure, etc. Typically such information is local; that is, it is related to the environment in the vicinity of the power analyser 10. Note that the non-electrical information is represented at the additional inputs as an electric signal—it is the quantity represented by the electric signal that corresponds to non-electrical information.

According to an embodiment, the processor 14 is further interfaced with a data input/output (data I/O) module 17. The data I/O module 17 enables the processor to communicate data, such as that stored in the storage memory 15, to external computing devices. The data I/O module 17 can comprise one or more of the following: a wired network interface connectable to a network, including the Internet, for example an Ethernet interface; a wireless network interface such as a Wi-Fi (IEEE 802.11a,b,g,n,etc.) or ZigBee (IEEE 802.15.4) interface connectable to a network, including the Internet; a proprietary wired or wireless interface; and any other suitable interface for allowing data communication. The data I/O module 17 can be configured for receiving data communications from external computing devices, such as commands intended for processing by the processor 14.

It is anticipated that data communications, both to and from the power analyser 10, should be subject to adequate data security measures. One particularly useful security measure is Anti Statistical Block Encryption (ASBE).

Still referring to FIG. 1, the power analyser 10 optionally comprises a human interface device (HID) module 18. The HID module 18 is either permanently connected or is connectable to one or more human interface devices (HIDs) 19. The HID module 18 is interfaced with the processor 14, and enables the processor 14 to display information to a user and/or to receive input from a user. HIDs 19 can include: displays, such as liquid crystal displays, for presenting to a user data stored in the storage memory 15 and/or information relating to the status of the power analyser 10, optionally touch screen displays having functionality to provide input to the processor 14; keyboards for allowing a user to input comments and data into the power analyser 10; and alarms (for example, visual and/or audible alarms) for enabling communication of events to users.

The processor 14 can also be interfaced to external equipment configured for receiving commands via a controller port, which may correspond to, for example, the I/O module 17. In this way, the power analyser 10 can be configured for sending commands, such as digital commands, to external equipment in the vicinity of the power analyser 10.

The processor 14 is configurable for processing the raw analogue data received from the analogue input module 11. The processed raw analogue data is referred to herein as measured analogue data, and is stored in the storage memory 15. The measured analogue data can be one or more of:

voltage;
current;
frequency;
spectrum;
harmonics and interharmonics; and
total harmonic distortion.

Figure 3:
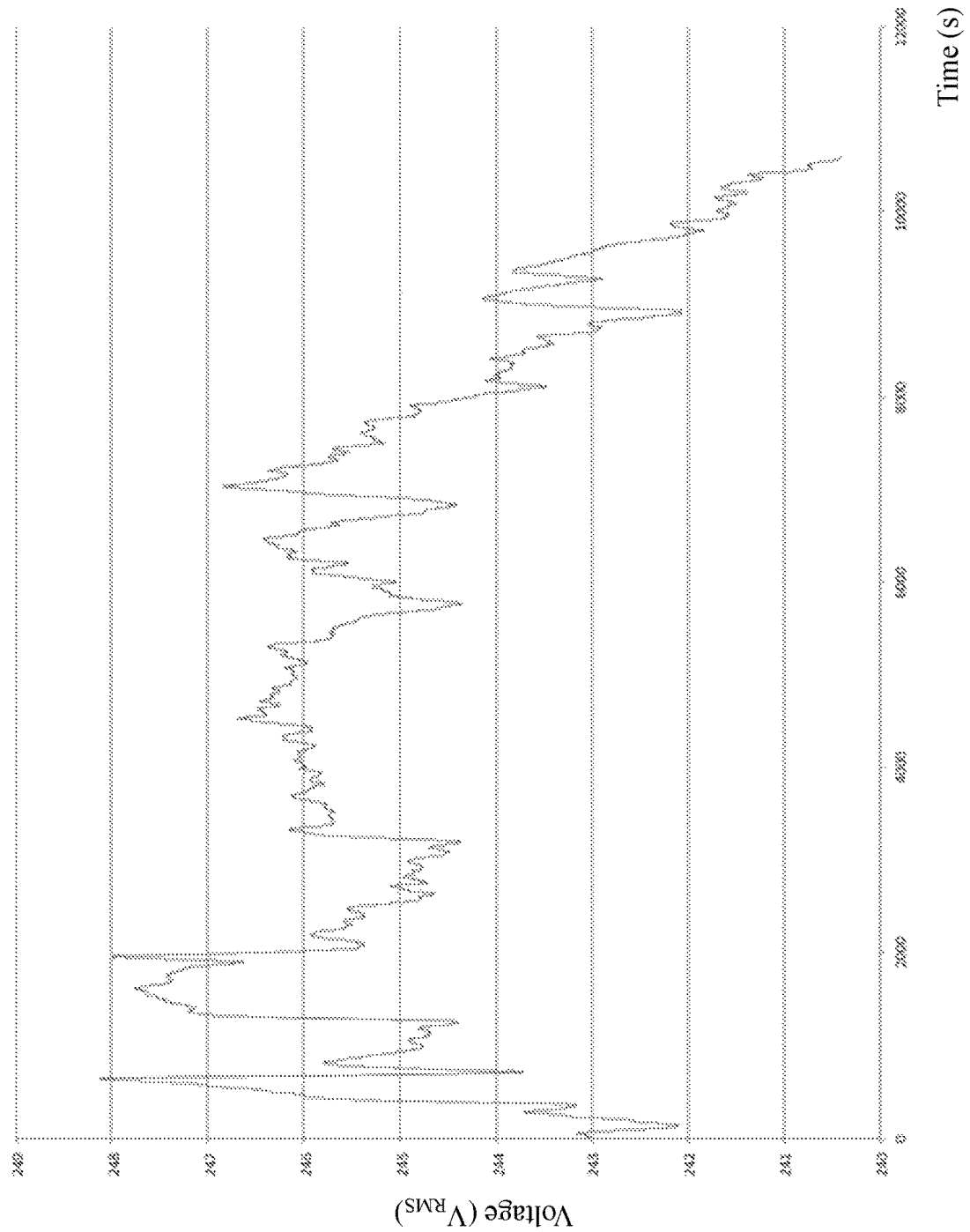
FIG. 3 shows an example of measured voltage data.
Figure 5:
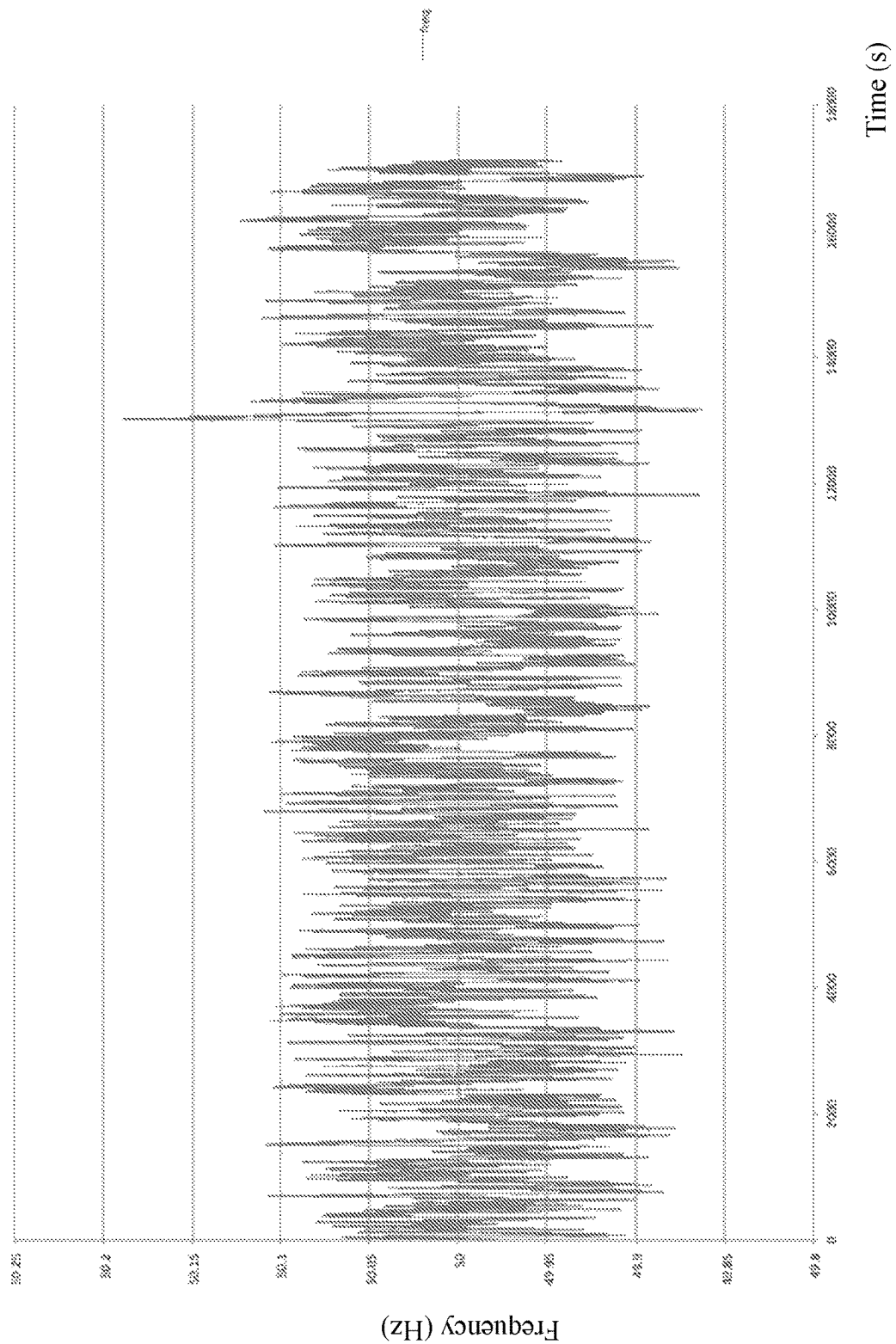
FIG. 5 shows an example of measured frequency data.

The voltage and current measured analogue data can be equivalent to the received raw analogue data, in particular when the power analyser 10 is implemented with one or more voltage interfaces 20 and one or more current interfaces 20. The remaining measured analogue data can be calculated, in this case, from the raw analogue data. FIG. 3 shows an example of measured voltage data (voltage in volts on the y-axis, time in seconds on the x-axis). FIG. 5 shows an example of measure frequency data, where frequency (in Hertz) is shown on the y-axis and time (in seconds) is shown on the x-axis. As can be seen in FIGS. 3 and 5, there is substantial variation in the nominal electrical characteristics of the electrical supply.

Therefore, it is understood that the measured analogue data can be: the raw analogue data itself, calculated from the raw analogue data, or a combination of the two.

Further processing can be undertaken by the processor 14 using known algorithms in order to produce derived analogue data. Such further processing includes determining:
- voltage (true RMS), typically providing a resolution of ±0.05% or better;
- current (true RMS), typically with a resolution of ±0.05% or better;
- power (true RMS), typically with a resolution of ±0.05% or better;
- Complex power analysis including real, reactive, apparent power components, typically with a resolution of ±0.05% or better;
- frequency of fundamental power signal, typically with a resolution of ±0.01 Hz or better;
- phase balance for each of the 3 phase voltage measurements and/or the 3 phase current measurements;
- phase angle between voltage and current measurements, typically with a resolution ±0.1% or better;
- power factor between voltage and current measurements, typically with a resolution of ±0.1% or better;
- phase identification of the individual voltage and current measurements;
- frequency spectrum (including inter-harmonics), typically with a resolution of 0.001 Hz frequency bins or better;
- harmonic levels for each of the power frequency harmonics;
- Total Harmonic Distortion (THD), with resolution of 0.1% THD of better;
- power flows for the input group (where said groups are implemented);
- power flows for the output group (where said groups are implemented);
- net power flow between the input and output groups (where said groups are implemented); and
- energy flows between location and the local energy grid.

The measured and/or derived analogue data can be stored in the storage memory 15. The processor 14 can also, or instead, be configured for producing the measured and/or derived analogue data "on-the-fly", that is, in response to a request for such data received from a user via the HID module 18 or via an external computer. On-the-fly derived data is computed from stored measured data and directly communicated to an external computer and/or an attached HID 19.

Raw analogue data can be sampled (therefore obtaining "samples") intermittently, preferably periodically. The term "real-time" herein means that samples are obtained sufficiently quickly (the sample rate is sufficiently low) to allow a user of the power analyser 10 to obtain necessary information within a convenient time. For example, a suitable sampling rate might be less than or equal to: one sample every ten minutes, preferably one sample every one second, and more preferably, one sample every 100 ms. A sampling rate of the power analyser 10 can be configurable, for example by a user via the HID 19, such as to select a suitable sampling rate for the user.

The analogue input module 11 can produce a large quantity of raw analogue data over a normal period of operation. The processor 14 can be configured for storing all of the measured analogue data and/or derived analogue data produced as a result. Alternatively, the processor 14 can be configured for storing a reduced dataset of the measured analogue data and/or derived analogue data. The reduced data set can comprise an appropriately selected averaging of the data, such as a moving mean.

Referring to FIG. 1, the power analyser 10 in an embodiment comprises a location module 24. The location module 24 is interfaced with the processor 14, and enables the processor 14 to determine the location of power analyser 10. The location module 24 can comprise an integrated or attached GPS unit and/or other location determining means (for example, based on cell-tower locations). Generally, the location is determined to within a nominal accuracy.

Still referring to FIG. 1, the power analyser 10 in an embodiment comprises a time module 25. The time module 25 is interfaced with the processor 14, and enables to processor 14 to determine a current time to a minimum or nominal accuracy, for example an accuracy of at least ±1 ms. Typically, for each data element of measured analogue data stored in the storage memory 15 a timestamp (that is, the current time when the measured analogue data is acquired or stored) is also recorded in the storage memory 15 such that the timestamp is associated with the particular record. The time module 25 can comprise one or more of: current time derived from an integrated or attached GPS unit; a time from a network time server in data communication with the processor 14, such as provided by the network time protocol (NTP); a cellular based time protocol; or any other suitable system for recording time accurately.

Figure 7A:
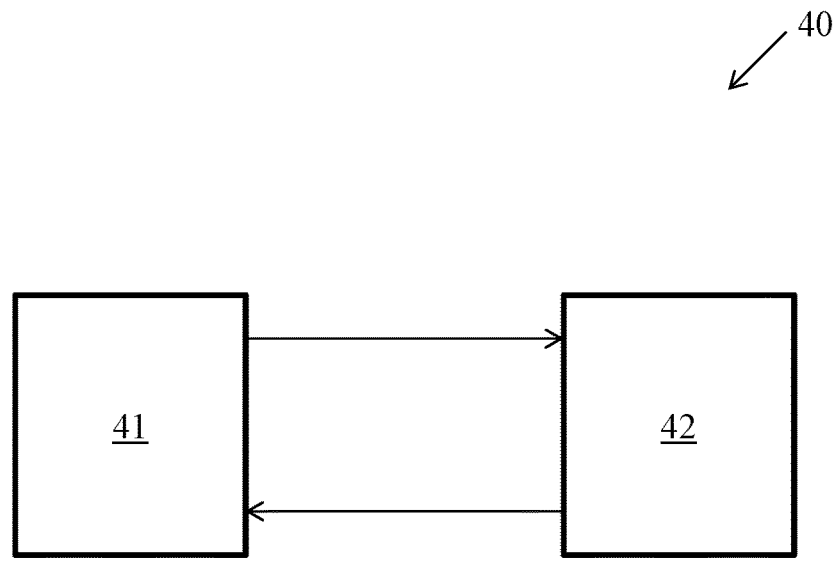
FIG. 7a shows an existing electrical system.

An electrical system 40 is shown in FIG. 7a, and in a broad sense comprises an electrical supply 41 and a load 42. The electrical supply 41 can correspond to a single power source, such as a mains supply (single phase or three phase). The load 42 also can correspond to a discrete load (such as a specific appliance) or can correspond to a collection of loads (such as a collection of pieces of equipment located within a factory).

Figure 7B:
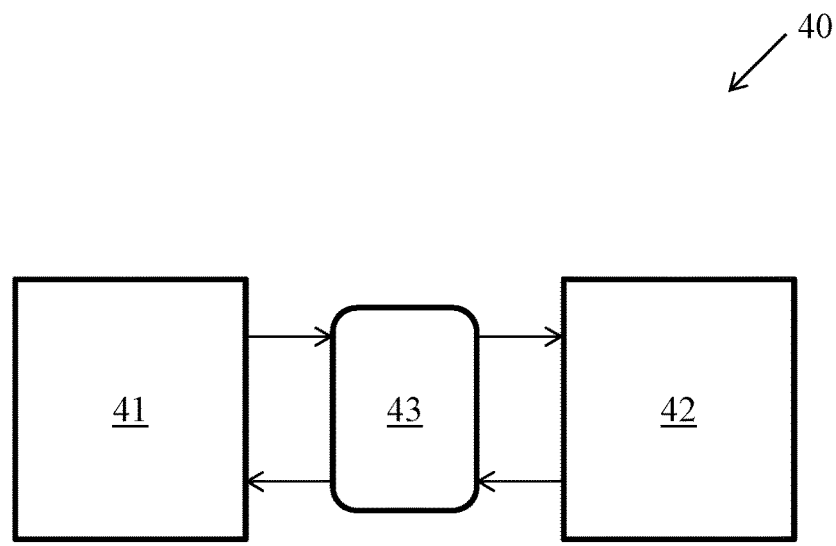
FIG. 7b shows the electrical system with a modification apparatus.

The electrical system 40 is modified by positioning a modification apparatus 43 between the electrical supply 41 and the load 42, as shown in FIG. 7b. The modification apparatus 42 modifies the power supply from the electrical supply 41 to the load, for example by modifying one or more electrical properties of the electrical supply 41 or by augmenting the electrical supply 41.

The power analyser 10 is configured to generate modified electrical supply estimate in accordance with a model and the raw analogue data. Typically, a suitable model is accessed from a database of pre-generated models, where the accessed model is associated with one or more characteristics of the load and/or one or more characteristics of the electrical supply and/or one or more characteristics of the modification apparatus 42. The database can be stored within the storage memory 15 (and is typically updatable) and/or is accessible via a data network, for example via the I/O module 17. The model can be selected by a user.

In an embodiment, the processor 14 of the power analyser 10 is configured (e.g. via execution of program code stored in the program memory 16) to apply the selected model to measured and/or derived analogue data in order to determine an estimate of the effect that the incorporation of a particular modification apparatus 43 will have to the power supply efficiency. The model may also utilise information obtained via the digital signal module 12 and/or additional signal module 13.

The modified electrical supply estimate represents an estimate in the change in efficiency in electrical power supply to the load 42 that will occur if a particular modification apparatus 43 were to be incorporated into the electrical system 40.

Generally, the modified electrical supply estimate can be expressed in a number of ways as desired by a user of the power analyser 10, and can be calculated by the processor 14 using the data stored in the storage memory 15 or by data acquired in real-time from the analogue signal module 11 and the modified electrical supply estimate. The modified electrical supply estimate can therefore represent a change as an average over a number of samples (i.e. a number of acquired measured and/or derived data points) or can be expressed as a plurality of values, each associated with a sample.

For example, through a HID 19 and/or data communication with an external computer, the modified electrical supply estimate can be expressed in units of: reduced power consumption, for example in kilowatts; reduced energy use, for example in kilowatt-hours; reduced monetary cost, for example in dollar savings; reduced production of Carbon Dioxide or an equivalent environmental measure; or any other suitable measure. The modified electrical supply estimate can also be expressed in terms to enable business decisions to be made, for example, as a Return on Investment (% pa), payback period, or as a capital investment requirement. Financial measures in particular can be determined through cost data available from an external source, such as a network connected database (for example, a cloud-based provider of such information).

Optionally, in conjunction with data acquired through communication with one or more external sources, such as databases accessible through a network connection.

Additional data can be obtained to assist with determining potential power supply efficiency improvements, for example, through network supplied data relating to the local ambient temperature(s), ambient humidity, ambient air pressure, and the local time.

Figure 6:
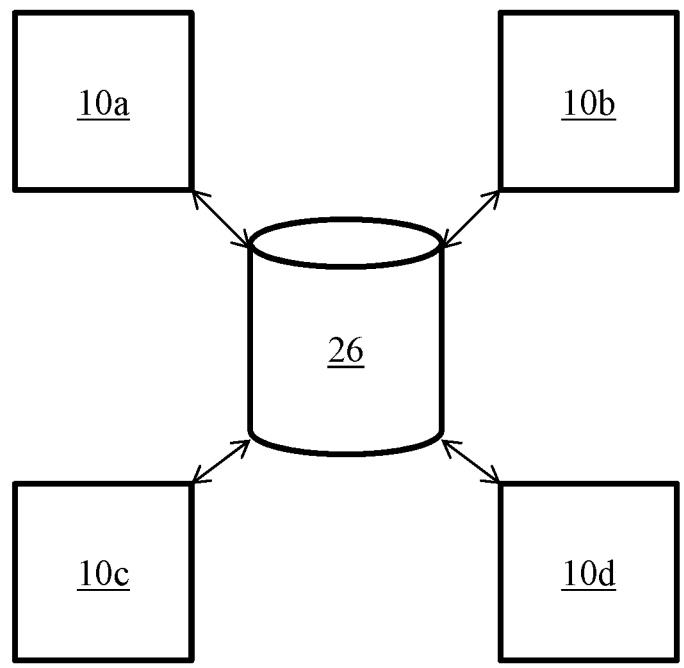
FIG. 6 shows a system comprising a plurality of power analysers and a system database.

Referring to FIG. 6, according to an embodiment, a plurality of (in this case four) of power analysers 10a-d is provided. Each of the power analysers 10a-d is in network communication with a system database 26. Each power analyser 10a-d configured to in real-time or periodically communicate measured analogue data and/or derived analogue data to the system database 26. The received data is recorded in the system database 26 in association with the timestamp for each data element, and preferably is association with the location of the power analyser 10a-d. According to this embodiment, each power analyser 10a-d is synchronised so that data recorded by one data analyser 10a-d can be compared temporally to data recorded by another data analyser 10a-d. The embodiment of FIG. 6 allows for comparison of power usage by loads separated by location, permitting synchro-phasor analysis. The system database 26 may be maintained separately to the power analysers 10a-d, or may be a module of one of the plurality of power analysers 10a-d.

Typically, the power analyser 10 is configured to be powered by a mains power supply, such that it is permanently powered. In an embodiment, a battery is provided to allow for operation during power interruption. In a related embodiment, a battery is provided for powering the power analyser 10 separately to the mains power supply.

In an embodiment, the analogue input module 11 of the power analyser 10 can be calibrated. A calibration device is provided, typically a certified calibration device, which is used as a master device. The calibration device is configured to communicate a precision measurement value (that is, a precise current or voltage or other relevant electrical signal property) to the analogue input module 11, for example by electrically coupling the calibration device to an analogue interface 20. Each analogue interface 20 can be separately calibrated. The power analyser 10 can be referred to as a slave device.

The power analyser 10 is configured to request confirmation of the value of the analogue signal being provided by the calibration device (e.g. voltage or current). For example, the request is made by the processor 14 via the data I/O module 17 where the calibration device is in communication with the data I/O module 17. The processor 14 can then utilise the confirmed value to "self-calibrate" the analogue input module 11. Typically, this is achieved by modifying a digital calibration coefficient.

Calibration according to the described embodiment can be undertaken at manufacture of the power analyser 10, during installation of the power analyser 10, and/or other circumstances where an automated calibration of the power analyser 10 is advantageous.

The analogue input module 11 can be adjusted manually, for example, through a user interacting with the power analyser 10 through an HID 19 or through communication utilising an external computer.

A power analyser 10 can also obtain suitable calibration coefficient(s) from a network accessible calibration database. The calibration database contains data acquired from a number of separate power analysers 10. Calibration is achieved by selecting data from power analysers 10 in geospatial proximity to the power analyser 10 requiring recalibration. A power analyser 10 may undertake a recalibration is response to an instruction received from an external computing device.

In an embodiment, the modification apparatus 43 is a voltage optimiser and the modified electrical supply estimate is a voltage optimisation estimate—i.e. the power analyser 10 is configured to estimate a change (usually an improvement) in efficiency that would result through the installation of the voltage optimiser between the power supply 41 and the load 42.

A voltage optimisation unit reduces the mean in supply-side voltage (that is, the voltage of the electrical supply 41) that is connected to the load. Depending upon the configuration of the voltage optimisation unit it may also reduce the variation in supply-side voltage (that is, the voltage of the electrical supply 41) that is connected to the load, preferably to a constant level. A voltage optimisation unit may not actually be present at the location when the estimate is made, thus the modified electrical supply estimate is a prediction of what might be possible.

The power analyser 10 can be utilised to measure the real-time voltage and/or current at the load.

A model predicts the change in energy consumption (usually expected to correspond to energy savings). The model can take as its input the actual voltage samples obtained by the power supply 10, being the voltage supplied to the load by the electrical supply. The model is typically associated with a particular voltage optimisation unit.

The model compares the voltage samples to an optimum voltage level associated with the load e.g. the voltage level for which the load has been designed. This may be, for example, a calculated optimum voltage level, a measured optimum voltage level, or a voltage level specified by the manufacture of the load.

The model may also take other measured quantities as previously discussed, including current samples, frequency, etc.

The processor 14 may be configured to utilise electrical circuit theory to suggest a model from a selection of possible models. A user can also, or instead, select a model from a database of pre-generated models via a user interface, such as one provided by a HID 19 or an external computer interfaced with the power supply 10.

This data may be stored in a network accessible database, or may be loaded into a database present within the storage memory 15 of the power analyser 10.

Figure 4:
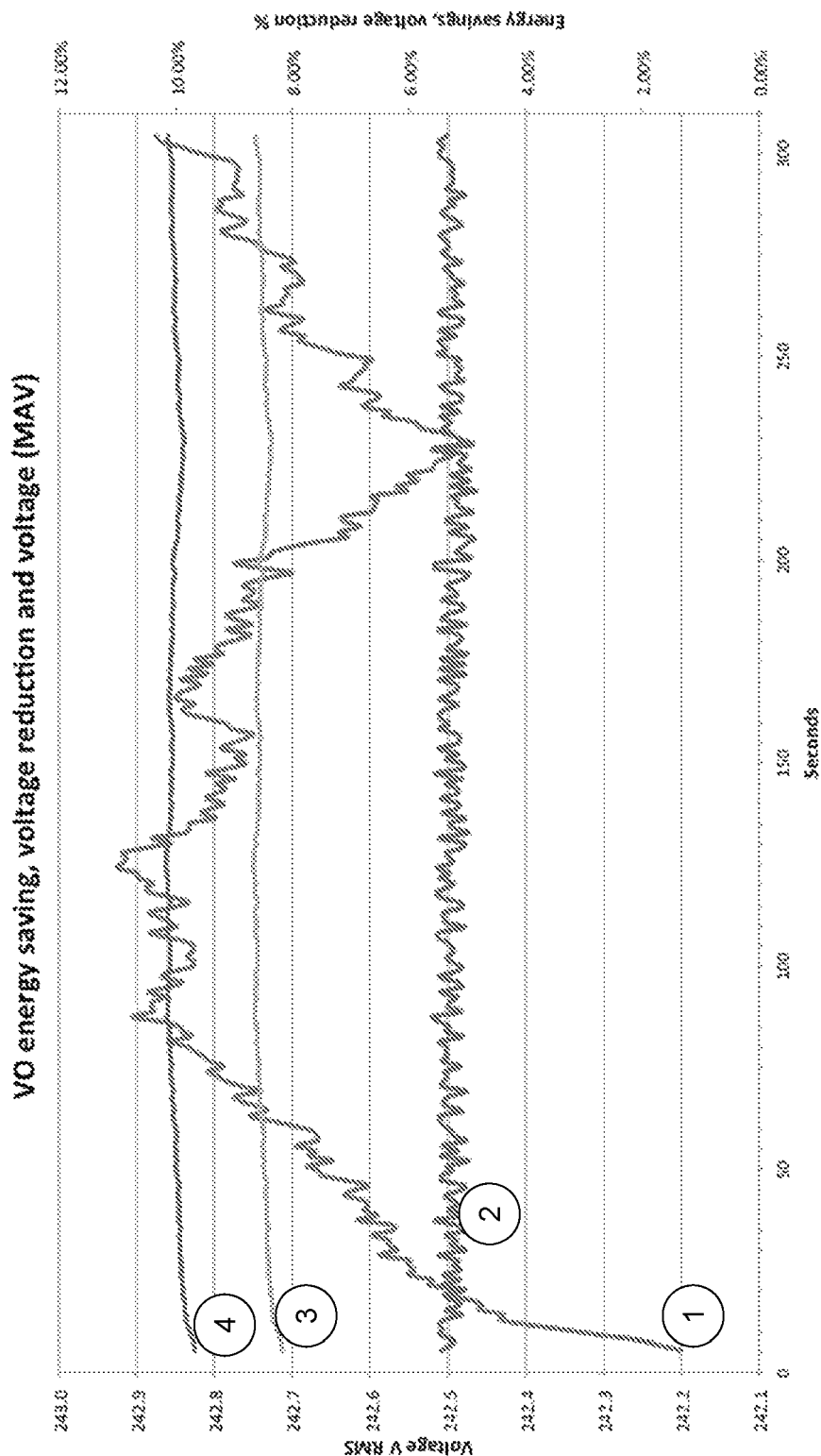
FIG. 4 shows an example of real-time predictions for voltage optimisation based savings.

FIG. 4 shows an example real-time predictions for voltage optimisation based savings. The figure shows plots of various quantities that have been filtered using a moving average filter. The quantities are marked numerically as:

Quantity (1): Supply Voltage RMS
Quantity (2): Predicted Voltage Reduction
Quantity (3): Predicted Energy Savings %
Quantity (4): Anticipated Energy Savings %

The Quantities 3 and 4 are examples of vendor specific savings metrics, which may vary according to model type.

In another embodiment, the modification apparatus 43 is a photovoltaic (PV) source and the modified electrical supply estimate a photovoltaic supply estimate—i.e. the power analyser 10 is configured to estimate a change in energy usage (usually energy savings) that might occur through the installation of a PV source into the electrical system 40. The modified electrical supply estimate may be for the PV source replacing the existing electrical supply 41 or augmented the existing electrical supply 41. A PV source provides electrical supply generated through irradiation by the sun.

The power analyser 10 uses a model which is configured to determine an optimal sizing of a PV generation source that might be attached to the load 42. The sizing of the PV generation source will be reported as optimised with respect to a choice of optimisation parameters, noting that different optimisation parameters may provide different recommendations, including: energy savings; maximum load reduction; capital investment required; return on investment; payback period; and tonnes of $CO_2$ reduced.

In another embodiment, the power analyser 10 can be utilised to estimate energy savings possible through introduction of a battery based energy storage system when a PV generation source is already present within the electrical system 40.

The power analyser 10 uses a model which is configured to determine an optimal sizing of a battery storage system that might be attached to the load 42. The sizing of the battery storage system will be reported as optimised with respect to a choice of optimisation parameters, noting that different optimisation parameters may provide different recommendations, including: energy savings; maximum load reduction; capital investment required; return on investment; payback period; and tonnes of $CO_2$ reduced.

In another embodiment, the power analyser 10 is utilised in estimating potential energy generation attributable to a PV source that is detected as already present as part of the electrical system 40 by the power analyser 10. The power analyser 10 requests from a suitable database, for example, through communication over a data network such as the Internet, the solar insolation of the location in which the power analyser 10 is present (this can be determined though the processor 14 interacting with the location module 24).

The power analyser 14 monitors the operation of the PV generation source, and builds a model representing the operation of the PV generation source, through the measurement of energy production and flows as they vary in time. Furthermore, the estimated capacity of the PV generation is also modelled by the power analyser 14.

Accordingly, using the solar insolation information and the estimated capacity of the PV generation source, it is possible to determine the maximum energy saving potential that may be attributed to the PV generation source.

The power analyser 10 also measures and creates a model of the load. This model enables forecasting of the load performance based on time of day.

The power analyser 10 thereby determines through application of the PV generation source model and the load model the instantaneous energy savings resulting from use of the PV generation source. Similarly, using the same model the forecast of the PV generation source model and the forecast of the load enables a forecast of energy savings from use of the PV generation source to be determined.

The power analyser 10 is thereby able to present to a user, via a HID or external computer, an analysis of the actual and predicted energy savings in power units [kW] and in energy units [kWh] over selected time intervals.

Furthermore, the power analyser 10 can download or be otherwise provided with local energy tariffs, which enables the power analyser 10 to present the results of the model in terms of an economic objective function (e.g. maximizing the $ value of savings).

In a variation of the previously described embodiment, the power analyser 10 can also incorporate an attached battery based energy storage system into its modelling (the battery storage system being interfaced with the PV generation source).

According to another embodiment, the power analyser 10 can provide an estimate of energy savings relating to identification of specific high usage connected loads, and recommendations for changing usage of those loads. Examples of connected loads of interest are: Air conditioning and heating loads (HVAC); Swimming pool heaters; Swimming pool pumps and filtration equipment; Spa heaters; Hot water heaters; Floor heating systems; Electric vehicle charging systems; and Clothes dryers.

The efficiency of these loads is of interest to consumers and utility energy providers for several reasons, including: Reducing the cost of energy consumed; Reducing the amount of energy consumed; Smoothing the demand, that is reducing the maximum power required; Managing the capacity and stability of the grid; Reducing the $CO_2$ footprint of the consumer; and Managing power quality.

The energy usage may be reduced in the following ways: Reduced maximum load; Reduced average load; Reduced load at times of peak tariff; and Reduced energy cost.

The power analyser 10 is therefore configured to provide recommendations for rescheduling loads to achieve decreased energy usage.

According to an embodiment, the power analyser 10 can be utilised in predicting energy savings relating to use of air-conditioning systems (HVAC) utilising heat pumps.

Many HVAC systems utilise obsolete and energy inefficient refrigerants. These HVAC systems account for a significant amount of the energy consumed in developed economies, and hence account for a significant proportion of the CO2 emitted into the atmosphere. The power analyser 10 is configured to measure the indoor environmental parameters at the location (temperature, humidity) and compare those against the external environmental parameters at the location (temperature, humidity)—the latter being available over the internet from the cloud service provided using the geospatial coordinates obtained by the location module 24.

The power analyser 10 models the efficiency of the HVAC system using the environmental parameters and the measured loads at the location. The power analyser 10 then provides summaries of the energy savings potential by: Making recommendations for operational changes to the HVAC set points and thermostat, and to the time of use, in order to maximize the operating efficiency of the HVAC system that is installed; and Upgrading the HVAC system, to ensure it operates at the best possible efficiency.

Furthermore, additional control strategies may be implemented, including: Automatically controlling individual loads to ensure that they operate in accordance with the optimal energy strategy as set out in the above; and automatic load shedding, whereby the power analyser 10 can limit demand within either the preset maximum energy demand, or to level the daily demand by rescheduling deferrable (non-time sensitive) loads.

Figure 8:
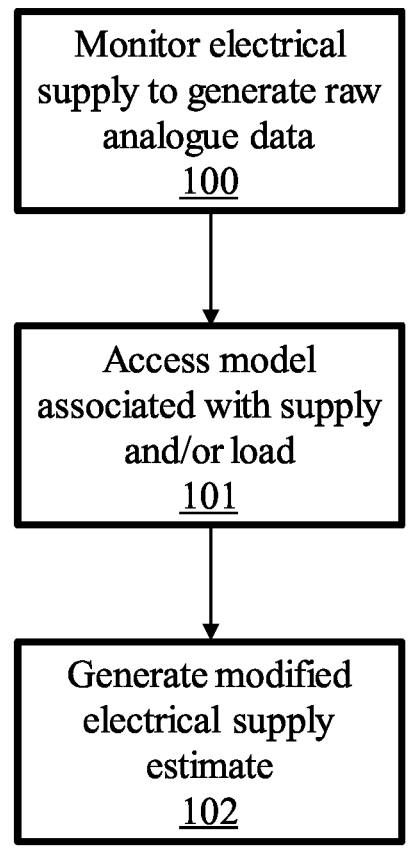
FIG. 8 shows a method of providing a modified electrical supply estimate.

FIG. 8 shows a method of providing a modified electrical supply estimate. The method comprises monitoring an electrical supply to a load to generate raw analogue data associated with the electrical supply to the load (step 100); accessing a model suitable for, or associated with, the electrical supply and/or the load (step 101); and generating a modified electrical supply estimate in accordance with the model and the raw analogue data (step 102). The method can be implemented by power analyser 10. The modified electrical supply estimate is a prediction of an effect of introducing a modification apparatus 42 associated with the model between the electrical supply 41 and the load 42. The modification apparatus 42 is not present between the electrical supply 41 and the load 42 when the modified electrical supply estimate is generated. It will be understood to persons skilled in the art of the invention that many modifications may be made without departing from the scope of the invention.

The invention claimed is:

1. A power analyzer for analyzing an electrical supply to a load, comprising:
    a processor;
    an analogue signal module interfaced with the processor, wherein the analogue signal module is configured to:
    create analogue signal measurements of the electrical supply, and
    provide raw analogue data corresponding to the analogue signal measurements to the processor;
and
    wherein the processor is configured to:
    access a model suitable for, or associated with, the electrical supply and/or the load, wherein the model includes characteristics of a modification apparatus, and
    generate a modified electrical supply estimate in accordance with the model and the raw analogue data using the characteristics of the modification apparatus, wherein the modified electrical supply estimate is a prediction of an effect of applying the model to the raw analogue data in accordance with incorporating the modification apparatus between the electrical supply and the load.

2. The power analyzer as claimed in claim 1, wherein the modified electrical supply estimate is a voltage optimization estimate.

3. The power analyzer as claimed in claim 1, wherein the modified electrical supply estimate is a secondary power supply estimate.

4. The power analyzer as claimed in claim 1, wherein the modified electrical supply estimate is associated with a voltage optimizer.

5. The power analyzer as claimed in claim 1, wherein the modified electrical supply estimate is associated with a photovoltaic power supply.

6. The power analyzer as claimed in claim 1, wherein the model is obtained from a database of pre-generated models.

7. The power analyzer as claimed in claim 1, wherein the analogue signal module comprises one or more analogue interfaces, each configured to produce an analogue signal.

8. The power analyzer as claimed in claim 6, wherein at least one analogue interface is a voltage interface and/or wherein at least one analogue interface is a current interface.

9. The power analyzer as claimed in claim 1, further comprising a controller port for enabling control of the load by the processor.

10. The power analyzer as claimed in claim 1, further comprising a location module, preferably including a GPS unit, interfaced with the processor and configured to determine a location of the power analyzer.

11. A method of providing a modified electrical supply estimate, comprising the steps of:
    monitoring an electrical supply to a load to generate raw analogue data associated with the electrical supply to the load;
    accessing a model suitable for, or associated with, the electrical supply and/or the load, wherein the model includes characteristics of a modification apparatus;
    generating a modified electrical supply estimate in accordance with the model and the raw analogue data using the characteristics of the modification apparatus, wherein the modified electrical supply estimate is a prediction of an effect of applying the model to the raw analogue data in accordance with incorporating the modification apparatus.

12. The method as claimed in claim 11, the method further comprising the step of: displaying the modified electrical supply estimate in real-time.

13. The method as claimed in claim 11, wherein the modified electrical supply estimate is a voltage optimization estimate.

14. The method as claimed in claim 11, wherein the modified electrical supply estimate is a secondary power supply estimate.

15. The method as claimed in claim 11, wherein the modified electrical supply estimate is associated with a voltage optimizer.

16. The method as claimed in claim 11, wherein the modified electrical supply estimate is associated with a photovoltaic power supply.

17. The method as claimed in claim 11, wherein the model is selected from a database of pre-generated models.

18. The method as claimed in claim 11, further comprising the step of:
    generating measured analogue data from the raw analogue data wherein the measured analogue data is utilized to generate the modified electrical supply estimate.

19. The method as claimed in claim 11, further comprising the step of:

generating derived analogue data from the raw analogue data wherein the derived analogue data is utilized to generate the modified electrical supply estimate.

20. A system for generating a modified electrical supply estimate, the system comprising:

an electrical supply monitor configured to monitor an electrical supply to a load and to generate raw analogue data associated with the electrical supply to the load;

a model accessor configured to enable access to a model suitable for, or associated with, the electrical supply and/or the load, wherein the model includes characteristics of a modification apparatus;

a modified electrical supply estimate generator, configured to generate a modified electrical supply estimate in accordance with the model and the raw analogue data using the characteristics of the modification apparatus, wherein the modified electrical supply estimate is a prediction of an effect of applying the model to the raw analogue data in accordance with incorporating the modification apparatus associated with the model between the electrical supply and the load.

\* \* \* \* \*